United States Patent
Huang et al.

(10) Patent No.: US 8,133,822 B2
(45) Date of Patent: Mar. 13, 2012

(54) METHOD OF FORMING SILICON NANOCRYSTAL EMBEDDED SILICON OXIDE ELECTROLUMINESCENCE DEVICE WITH A MID-BANDGAP TRANSITION LAYER

(75) Inventors: Jiandong Huang, Vancouver, WA (US); Pooran Chandra Joshi, Vancouver, WA (US); Hao Zhang, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 750 days.

(21) Appl. No.: 12/197,045

(22) Filed: Aug. 22, 2008

(65) Prior Publication Data

US 2008/0305566 A1    Dec. 11, 2008

Related U.S. Application Data

(63) Continuation-in-part of application No. 12/126,430, filed on May 23, 2008, now Pat. No. 7,998,884, which is a continuation-in-part of application No. 11/418,273, filed on May 4, 2006, now Pat. No. 7,544,625, and a continuation-in-part of application No. 11/327,612, filed on Jan. 6, 2006, now Pat. No. 7,723,242, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
*H01L 21/324* (2006.01)

(52) U.S. Cl. .................... 438/787; 438/788

(58) Field of Classification Search .............. None
See application file for complete search history.

(56) References Cited

U.S. PATENT DOCUMENTS

| | | | |
|---|---|---|---|
| 5,216,303 A | 6/1993 | Lu | |
| 6,184,158 B1 * | 2/2001 | Shufflebotham et al. | 438/788 |

(Continued)

FOREIGN PATENT DOCUMENTS

JP        2004296781        10/2004

(Continued)

*Primary Examiner* — Wael Fahmy
*Assistant Examiner* — Abul Kalam
(74) *Attorney, Agent, or Firm* — Law Office of Gerald Maliszewski; Gerald Maliszewski

(57) ABSTRACT

A method is provided for forming a silicon (Si) nanocrystal embedded Si oxide electroluminescence (EL) device with a mid-bandgap transition layer. The method provides a highly doped Si bottom electrode, and forms a mid-bandgap electrically insulating dielectric film overlying the electrode. A Si nanocrystal embedded SiOx film layer is formed overlying the mid-bandgap electrically insulating dielectric film, where X is less than 2, and a transparent top electrode overlies the Si nanocrystal embedded SiOx film layer. The bandgap of the mid-bandgap dielectric film is about half that of the bandgap of the Si nanocrystal embedded SiOx film. In one aspect, the Si nanocrystal embedded SiOx film has a bandgap (Eg) of about 10 electronvolts (eV) and mid-bandgap electrically insulating dielectric film has a bandgap of about 5 eV. By dividing the high-energy tunneling processes into two lower energy tunneling steps, potential damage due to high power hot electrons is reduced.

10 Claims, 9 Drawing Sheets

| U.S. PATENT DOCUMENTS | | | |
|---|---|---|---|
| 7,141,936 B2 | 11/2006 | McIntyre | |
| 2002/0043943 A1 | 4/2002 | Menzer | |
| 2004/0106285 A1* | 6/2004 | Zacharias | 438/689 |
| 2006/0180817 A1* | 8/2006 | Hsu et al. | 257/79 |

| FOREIGN PATENT DOCUMENTS | | |
|---|---|---|
| JP | 2006228916 | 8/2006 |
| WO | WO9602563 | 2/1996 |
| WO | WO9713391 | 4/1997 |

\* cited by examiner

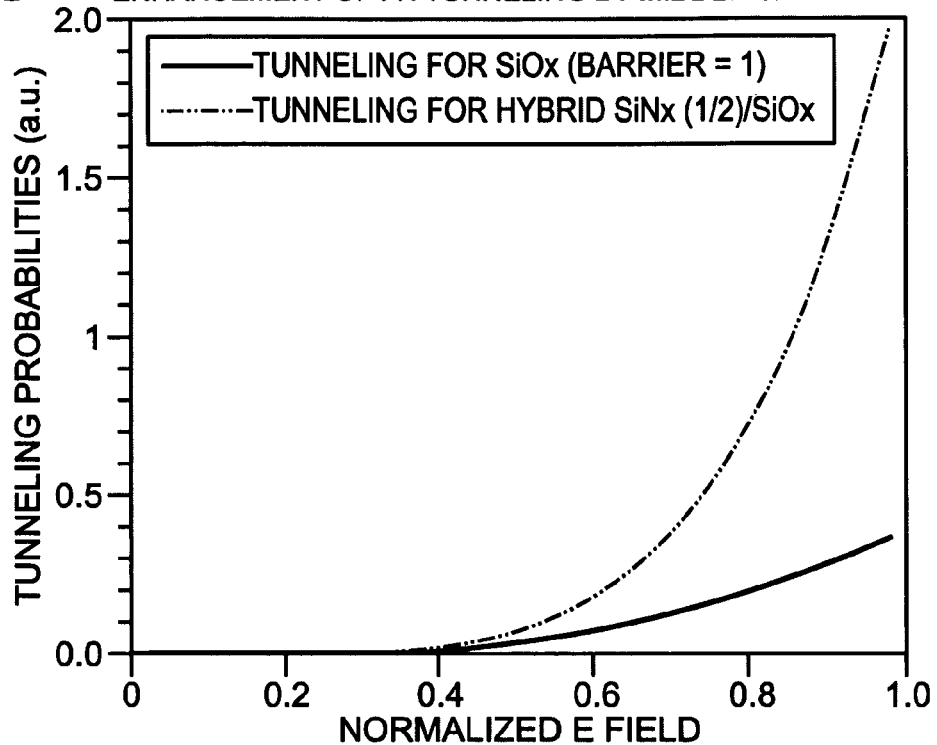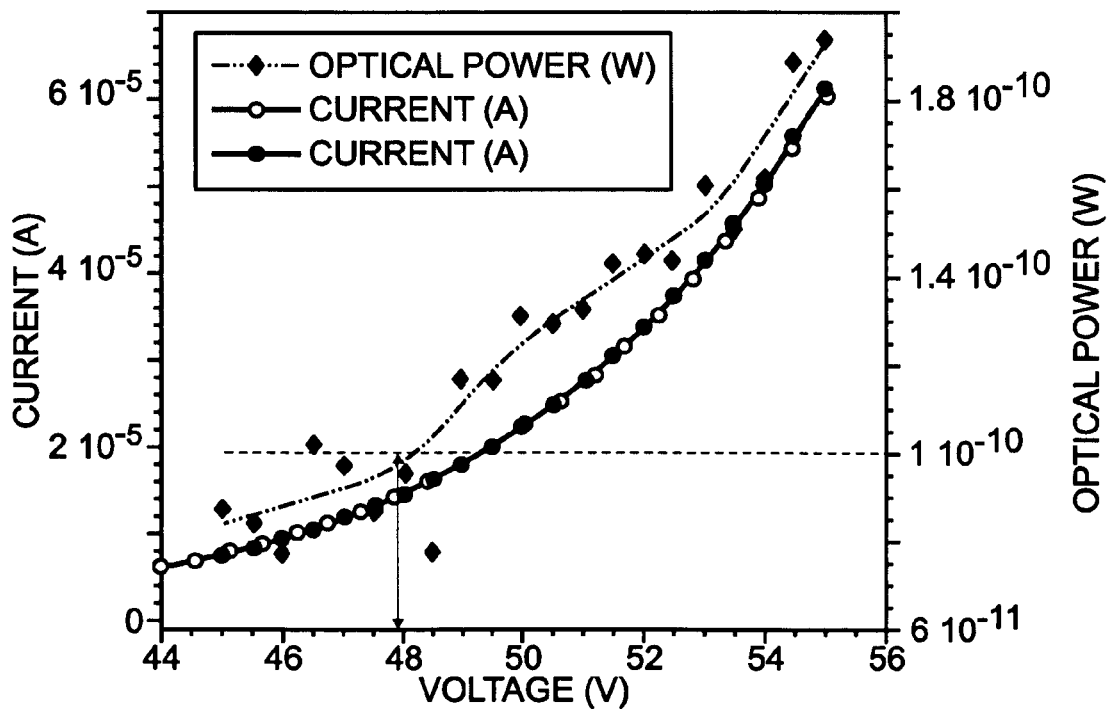

HISTOGRAM GRAPH 24V

HISTOGRAM GRAPH 28V

HISTOGRAM GRAPH 12V

METHOD OF FORMING SILICON NANOCRYSTAL EMBEDDED SILICON OXIDE ELECTROLUMINESCENCE DEVICE WITH A MID-BANDGAP TRANSITION LAYER

RELATED APPLICATIONS

This application is a continuation-in-part of a patent application entitled, LIGHT EMITTING DEVICE WITH A NANOCRYSTALLINE SILICON EMBEDDED INSULATOR FILM, invented by Huang et al., Ser. No. 12/126,430, filed on May 23, 2008 now U.S. Pat. No. 7,998,884, which is a Continuation-in-Part of the following applications:

SILICON OXIDE THIN-FILMS WITH EMBEDDED NANOCRYSTALLINE SILICON, invented by Pooran Joshi et al., Ser. No. 11/418,273, filed May 4, 2006 now U.S. Pat. No. 7,544,625;

ENHANCED THIN-FILM OXIDATION PROCESS, invented by Pooran Joshi et al., Ser. No. 11/327,612, filed Jan. 6, 2006 now U.S. Pat. No. 7,723,242;

HIGH-DENSITY PLASMA HYDROGENATION, invented by Pooran Joshi et al., Ser. No. 11/013,605, filed Dec. 15, 2004 now U.S. Pat. No. 7,446,023;

DEPOSITION OXIDE WITH IMPROVED OXYGEN BONDING, invented by Pooran Joshi, Ser. No. 10/801,377, filed Mar. 15, 2004 now U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663;

METHOD FOR FABRICATING OXIDE THIN-FILMS, invented by Joshi et al., Ser. No. 10/801,374, filed Mar. 15, 2004 now U.S. Pat. No. 7,087,537.

All the above-referenced applications are incorporated herein by reference.

BACKGROUND OF THE INVENTION

1. Field of the Invention

This invention generally relates to integrated circuit (IC) fabrication and, more particularly, to a light emitting device made from a silicon (Si) nanocrystal embedded silicon oxide film and a mid-bandgap electrically insulating dielectric film.

2. Description of the Related Art

The unique structural, electrical, and optical properties of nanocrystalline silicon have attracted interest for their use in optoelectronic and integrated memory devices. Silicon is the material of choice for the fabrication of optoelectronic devices because of well-developed processing technology. However, the indirect band-gap makes it an inefficient material for light emitting optoelectronic devices. Over the years, various R&D efforts have focused on tailoring the optical function of Si to realize Si-based light emitting optoelectronics. The achievement of efficient room temperature light emission from the nano-crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_x$ thin films depend on the size, concentration, and size distribution of the Si nanocrystals. Various thin-film deposition techniques such as sputtering and plasma-enhanced chemical vapor deposition (PECVD), employing capacitively-coupled plasma source, are being investigated for the fabrication of stable and reliable nanocrystalline Si thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Any attempt to enhance the reaction kinetics by increasing the applied power results in increased bombardment of the deposited film, which creates a poor quality films with a high defect concentration. Additionally, the low plasma density associated with these types of sources ($\sim 1 \times 10^8$-$10^9$ cm$^{-3}$) leads to limited reaction possibilities in the plasma and on the film surface, inefficient generation of active radicals for enhanced process kinetics, inefficient oxidation, and reduction of impurities at low thermal budgets, which limits their usefulness in the fabrication of low-temperature electronic devices.

A deposition process that offers a more extended processing range and enhanced plasma characteristics than conventional plasma-based techniques, such as sputtering, PECVD, etc., is required to generate and control the particle size for PL/EL based device development. A process that can enhance plasma density and minimize plasma bombardment will ensure the growth of high quality films without plasma-induced microstructural damage. A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality SiOx thin films, the oxidation of the growing film is also critical to ensure high quality insulating layer across the nanocrystalline Si particles. A process that can generate active oxygen radicals at high concentrations will ensure effective passivation of the Si nanoparticles in the oxide matrix surrounding it. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and it is not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, temperature, thermal budget, density, microstructure, interface quality, impurities, plasma-induced damage, state of the plasma generated active species (radicals/ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high density plasma systems, as the plasma energy, composition (radical to ions), plasma potential, electron temperature, and thermal conditions correlate differently depending on the process map.

Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

To date, electrically pumped light emitting devices using Si nanocrystal embedded Si oxide (SiOx) films as an active layer, require relatively large turn-on voltages. These turn-on voltages, often greater than 80V, prevent the practical application of such devices. At least part of the problem associated with the high turn-on voltages is related to the relatively high bandgap (approximately 10 electronvolts) of the Si nanocrystalline SiOx films.

It would be advantageous if an EL device could be fabricated in such a way as to enhance current injection through the high bandgap associated with Si nanocrystal embedded SiOx films, so that the EL devices could be operated with lower turn-on voltages.

SUMMARY OF THE INVENTION

A method is provided to achieve low turn-on voltages for electrically pumped Si nanocrystal embedded oxide (SiOx) light emitting devices (LEDs). The active layers of the LEDs are SiOx deposited on Si wafers using HDPCVD (high density plasma-enhanced chemical vapor depositions) processes. The carrier transport process inside the LEDs is Fowler-Neidheim tunneling. Since the barrier height of SiOx is high, the tunneling efficiencies are low. However, a SiNx layer, or similar material, having a smaller barrier height, can be introduced between the SiOx layer and Si wafers. In this hybrid device, the tunneling of the carrier is then divided into two steps to promote tunneling to the SiOx film for light emission. A theoretical model shows that the carrier current injection efficiencies for a device using a mid-bandgap film are several times higher, using practical operational electrical fields, leading to a large reduction in turn-on voltage. Experimental results confirm the predictions and turn-on voltages of less than 10V are achieved, at the same emission power of conventional SiOx devices requiring turn-on voltages as high as ~80V.

Accordingly, a method is provided for forming a silicon (Si) nanocrystal embedded Si oxide electroluminescence (EL) device with a mid-bandgap transition layer. The method provides a highly doped Si bottom electrode, and forms a mid-bandgap electrically insulating dielectric film overlying the Si bottom electrode. A Si nanocrystal embedded SiOx film layer is formed overlying the mid-bandgap electrically insulating dielectric film, where X is less than 2, and a transparent top electrode overlies the Si nanocrystal embedded SiOx film layer. The bandgap of the mid-bandgap electrically insulating dielectric film is about half that of the bandgap of the Si nanocrystal embedded SiOx film.

In one aspect, the Si nanocrystal embedded SiOx film has a bandgap (Eg) of about 10 electronvolts (eV) and mid-bandgap electrically insulating dielectric film has a bandgap of about 5 eV. In one aspect, the mid-bandgap electrically insulating dielectric film is a silicon nitride (SiNy) layer, where Y is about 4/3, the bandgap of the film is about 5 eV, and the film thickness is in the range of 1 to 30 nanometers (nm).

Additional details of the above-described method, and a method for operating a Si nanocrystal embedded Si oxide EL device with a mid-bandgap transition region are presented below.

BRIEF DESCRIPTION OF THE DRAWINGS

FIG. 6 is a diagram depicting the tunneling calculated probabilities for direct and two-step tunneling, based on Equation 3, and by assuming there are no interface charge accumulations.

FIG. 8 is a graph of the device of FIG. 7, cross-referencing optical output power to turn-on voltage.

DETAILED DESCRIPTION

Figure 1:
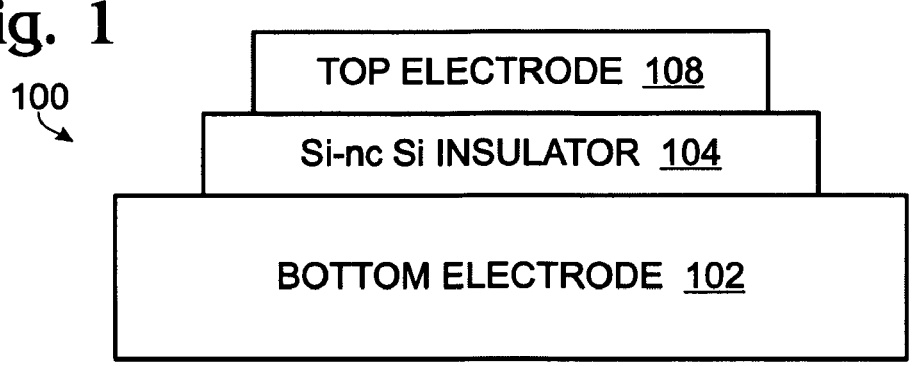
FIG. 1 is a partial cross-sectional view of an electroluminescence (EL) device made using a silicon (Si) nanocrystal embedded silicon oxide (SiOx) film.

FIG. 1 is a partial cross-sectional view of an electroluminescence (EL) device made using a silicon (Si) nanocrystal embedded silicon oxide (SiOx) film. The electrically pumped light emitting device 100 is fabricated using a Si nanocrystal embedded SiOx film 104 as active layer overlying a doped silicon wafer 102. A transparent top electrode 108 of ITO (Indium Tin Oxide) overlies the SiOx film 104. The SiOx active layer 104 can be deposited using HDPCVD (High Density Plasma-enhanced Chemical Vapor Depositions) processes, as explained in more detail below.

Figure 2:
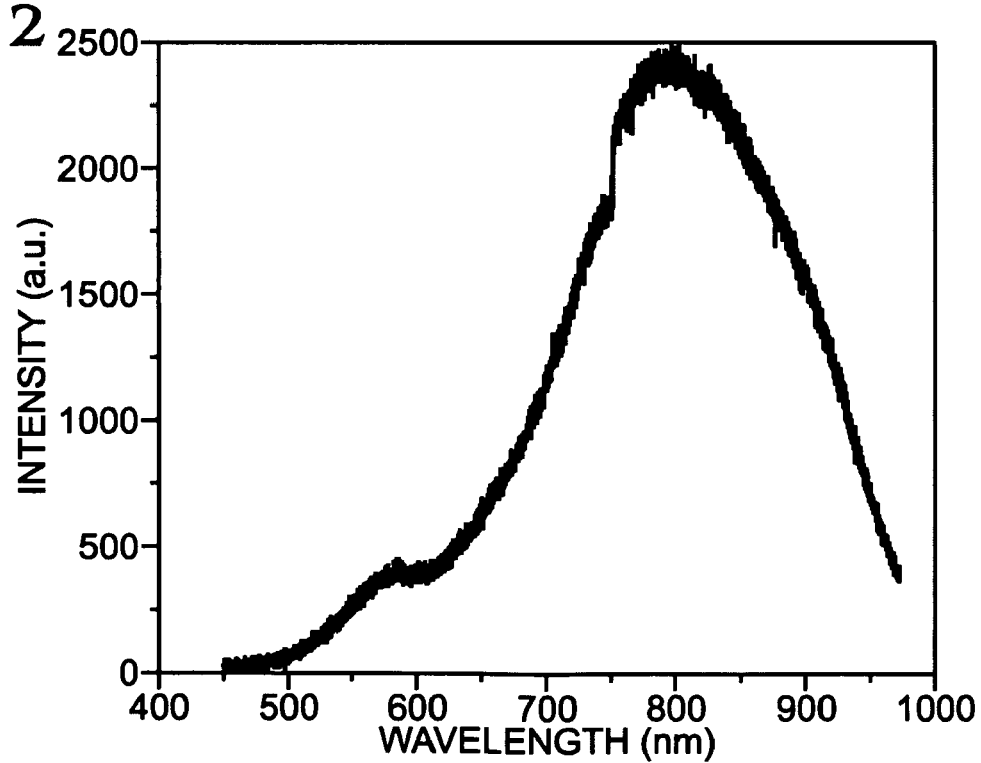
FIG. 2 is a graph depicting the light intensity of an exemplary SiOx EL device as a function of wavelength.

FIG. 2 is a graph depicting the light intensity of an exemplary SiOx EL device as a function of wavelength. The surface emission wavelength is centered around 800 nm with a spectral width of about 150 nm (Full Width at Half Magnitude). A monochromator with a multiple-mode fiber may be used as a probe to collect and deliver light from an EL device and to measure the light emitting spectra. An emissions peak at ~800 nanometers (nm) is shown, which is very close to the photoluminescence (PL) peak wavelength.

Figure 3:
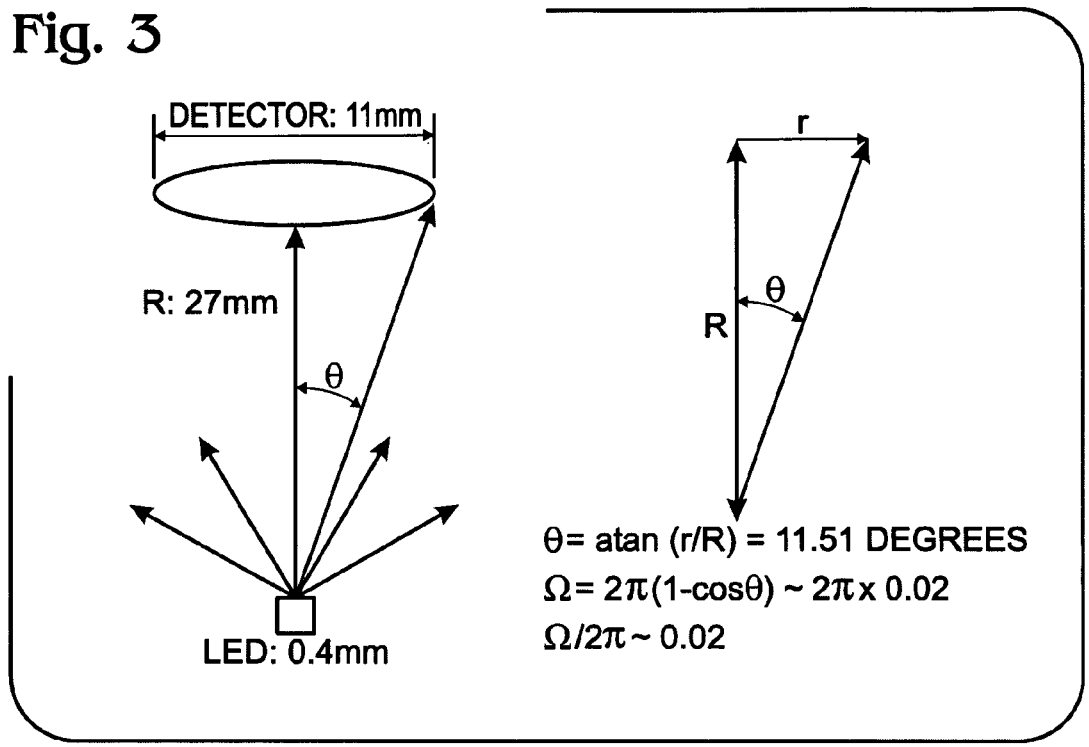
FIG. 3 is a diagram depicting a light intensity measurement setup.

FIG. 3 is a diagram depicting a light intensity measurement setup. The light emitting device can be regarded as point light source due to the small ratio of the cross-section with respect to the distance R.

Experimental results show that the optical output is strongly correlated to the current injection levels, and that the same level of current injection produces similar optical outputs, regardless of the various HDPCVD processes used to fabricate the device.

Figure 4:
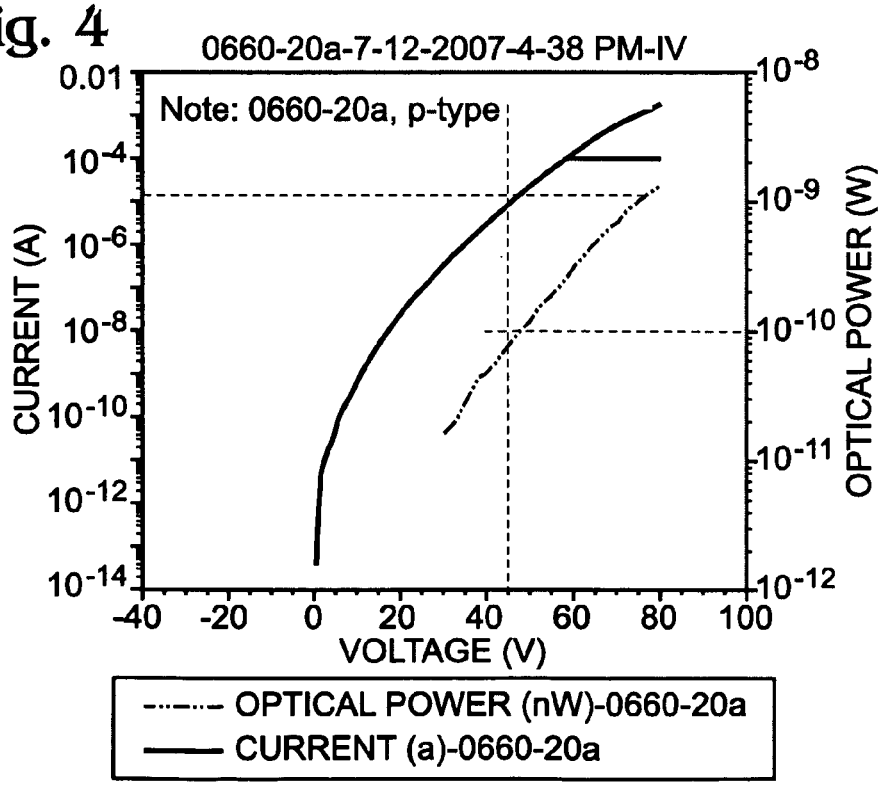
FIG. 4 is a graph cross-referencing injection current, turn-on voltage, and optical output power for a conventional SiOx EL device.

FIG. 4 is a graph cross-referencing injection current, turn-on voltage, and optical output power for a conventional SiOx EL device. An optical output level of 0.1 nano-watt (nW) is shown corresponding to a turn-on voltage of 80 volts.

These experimental observations can be summarized as $$Q \propto \eta \times f(I) \quad \text{Equation 1}$$

In which, Q stands for the optical output power, η is related to photoluminescence (PL) quantum efficiencies, and f(I) represents the effects of currents. These experimental observations indicate that turn-on voltages can be decreased by improving the current injection efficiencies, i.e., with lower biased voltages to create higher current injections.

It is generally believed that Fowler-Nordheim (FN) tunneling dominates the carrier transport process for SiOx based LEDs. The Fowler-Nordheim process can be expressed as the following:

$$J \propto E^2 \times \exp(-E_{Gap}^{3/2}/E) \quad \text{Equation 2}$$

In which E is the electrical field, and $E_{Gap}$ (or Eg) is proportional to the barrier height $\phi_B$. Due to the high barrier of SiOx, the current injection efficiencies are low, leading to the high turn-on voltages. This means that the tunneling possibility $P \propto E^2 \times \exp(-E_{Gap}^{3/2}/E)$.

Figure 5A:
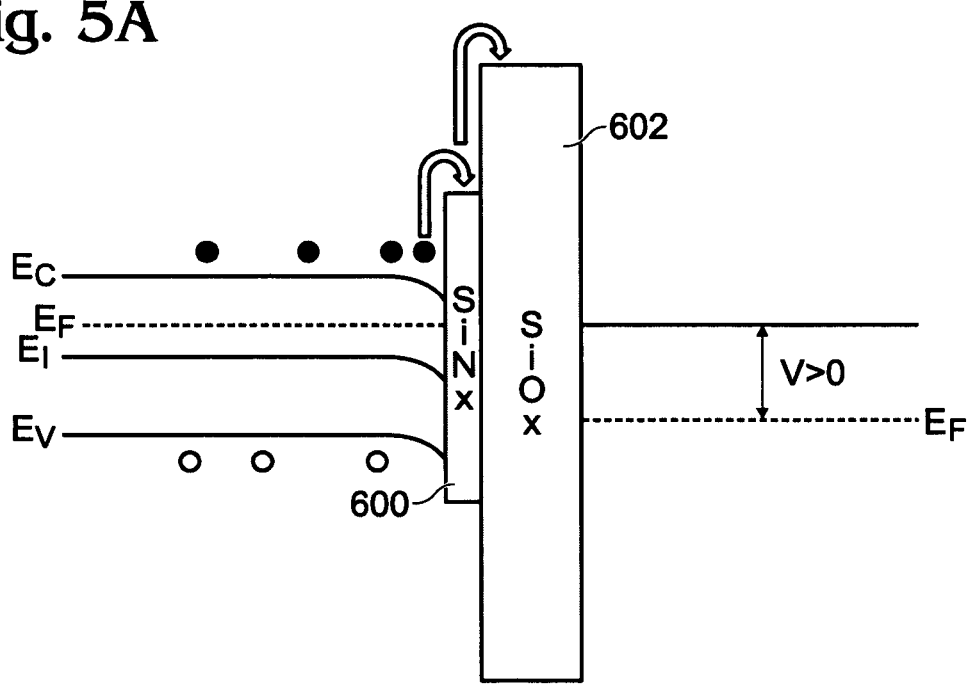
FIG. 5A is a cross-sectional energy diagram depicting a Si nanocrystal embedded SiOx film with a mid-bandgap electrically insulating dielectric film.

FIG. 5A is a cross-sectional energy diagram depicting a Si nanocrystal embedded SiOx film with a mid-bandgap electrically insulating dielectric film. In a highly doped Si substrate the electron Fermi level can be regarded as overlapping with the Si conduction bandgap of 1.12 eV, which is negligible compared with the 10 eV SiOx bandgap. The structure of FIG. 5A increases current injection efficiencies. A thin layer of a mid-bandgap material 600 with a low tunneling barrier (in this case, SiNx) is introduced between the Si electrode (not shown) and SiOx layer 602. The mid-bandgap thin layer 600 divides the FN tunneling into two consecutive steps: (1) first to the low barrier band; and, (2) then to the final SiOx band, as shown by the arrows. In a simple assumption, the final tunneling probabilities P can be expressed as $$P = P_1 \times P_2 \quad \text{Equation 3}$$

Figure 5B:
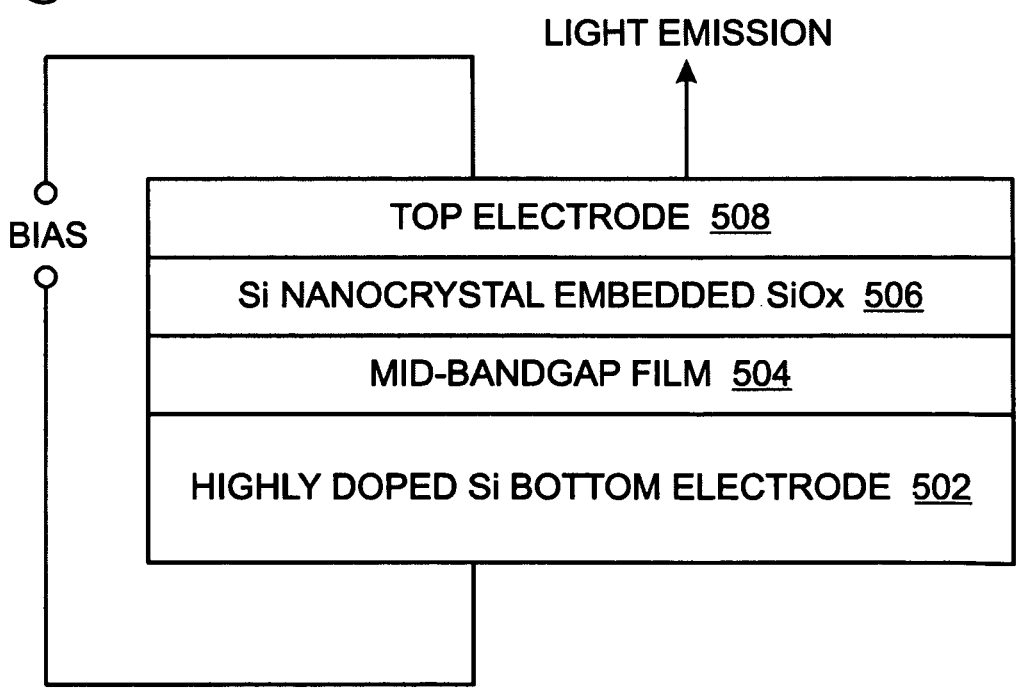
FIG. 5B is an EL device with a Si nanocrystal embedded SiOx film and a mid-bandgap electrically insulating dielectric film biased to emit light.

FIG. 5B is an EL device with a Si nanocrystal embedded SiOx film and a mid-bandgap electrically insulating dielectric film biased to emit light. The highly doped bottom electrode 502 can be either n or p doped. A mid-bandgap electrically insulating film 504 overlies the bottom electrode 502. A Si nanocrystal embedded SiOx film 506 overlies the mid-bandgap film 504, and a transparent top electrode 508 overlies the SiOx film 506. If the substrate (bottom electrode) is n doped, the substrate can be connected to ground and transparent electrode 108 connected to a positive voltage source. If the substrate is p doped, the transparent substrate 108 can be connected to ground and substrate 106 connected to a negative positive voltage source.

FIG. 6 is a diagram depicting the calculated tunneling probabilities for direct and two-step tunneling, based on Equation 3, and by assuming there are no interface charge accumulations. For simplicity, it can be assumed that the low barrier is exactly half of barrier height of SiOx. It is clearly seen that the probabilities for two-step tunneling are dramatically increased at high biased fields.

Test wafers were fabricated using HDPCVD processes. The wafer lists are summarized in Table 1: SiNx layers of two thicknesses at 9 nm and 2 nm were deposited between the Si wafer and SiOx layers on wafer 0741-6 and 0741-7. The other wafers are conventional SiOx LEDs for comparison.

TABLE 1

Wafer Splits for Verification of Efficient Two-Step Transport Processes
Lot 0741, Wafer List and Deposition Conditions
Date: Jul. 02, 2007

| Wafer ID | Wafer Type/ Stack | SiH4 | N2O | He | H2 | P (mTorr) | Temp. C. | Power (W) | Time(s) | Thick. (A) | Dep Rate (A/s) | Optical Const. @ 365 | | Optical Const. @ 632 | |
|---|---|---|---|---|---|---|---|---|---|---|---|---|---|---|---|
| | | | | | | | | | | | | n | k | n | k |
| Jul. 2, 2007 | | | | | | | | | | | | | | | |
| 0741-1 | SiOx/n + Si | 25 | 32 | 150 | 450 | 90 | Setup = 250. real = 150 | 250 | 540 | 1155 | | 1.87 | 0.03 | 1.74 | 0.0013 |
| 0741-2 | SiOx/n + Si | 25 | 32 | 150 | 450 | 90 | | | 540 | 1155 | | 1.87 | 0.03 | 1.74 | 0.0013 |
| 0741-3 | 3-layer SiOx/n + Si* | 25 | 25/41 | 150 | 450 | 90 | | | | 110/90 | | | | | |
| 0741-4 | 5-layer SiOx/n + Si** | 25 | 25/41 | 150 | 450 | 90 | | | | 88/76 | | | | | |
| 0741-5 | SiOx/p + Si | 25 | 32 | 150 | 450 | 90 | | | 540 | 1116 | | 1.87 | 0.03 | 1.74 | 0.0013 |
| 0741-6 | SiOx/9 nm SiNx/n + Si | 25 | 32 | 150 | 450 | 90 | | | 540 | 1122 | | 1.91 | 0.04 | 1.75 | 0.000 |
| 0741-7 | SiOx/2 nm SiNx/n + Si | 25 | 32 | 150 | 450 | 90 | | | 540 | 1122 | | 1.91 | 0.04 | 1.75 | 0.000 |
| 0741-8 | SiOx/n + Si | 25 | 32 | 150 | 450 | 90 | | | 540 | 1122 | | 1.91 | 0.04 | 1.75 | 0.000 |

3-layer/n + Si: 25 nm HC/50 nm HCE/25 nm HC/Si substrate
5-layer/n + Si: 20 nm HC/20 nm HCE/20 nm HC/20 nm HCE/20 nm HC/Si substrate In order to accurately measure the emission powers and profiles of the LEDs, a CCD camera was used to image the emission. The calibration was made by using standard calibrated photo detector with known samples of the same dimensions. Histogram peaks at an amplitude of 200 correspond to 0.1 nW (definition of voltage turn-on threshold) in the test system of FIG. 3.

Figure 7:
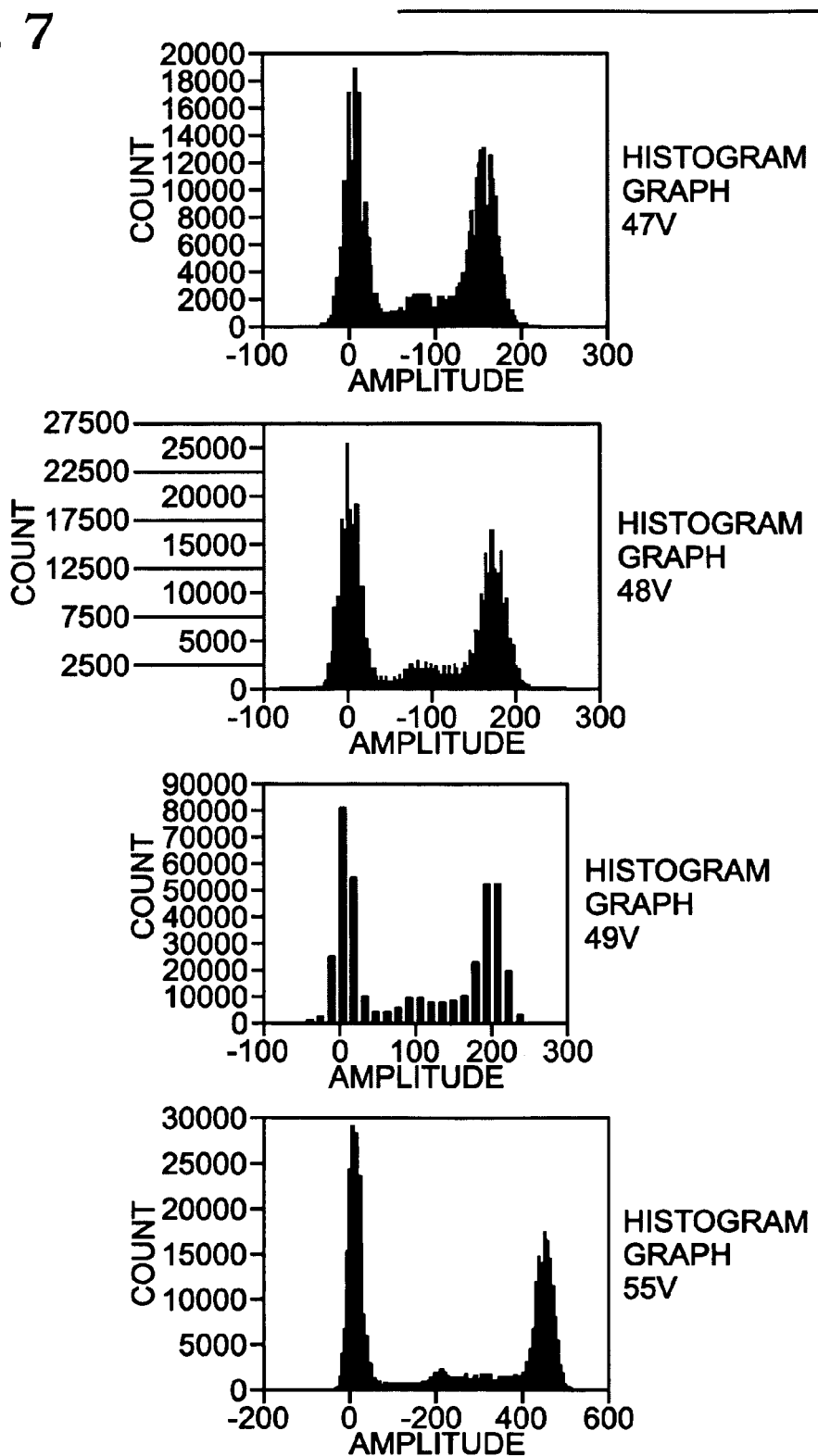
FIG. 7 shows graphs of histogram peaks at various turn-on voltages for a conventional SiOx EL device.

FIG. 7 shows graphs of histogram peaks at various turn-on voltages for a conventional SiOx EL device. As shown, the EL device has histogram peaks at an amplitude approaching 200 when the turn-on voltage is 48 V.

FIG. 8 is a graph of the device of FIG. 7, cross-referencing optical output power to turn-on voltage. It is clearly seen the turn-on voltage threshold at 0.1 nW occurs at 48V.

Figure 9A:
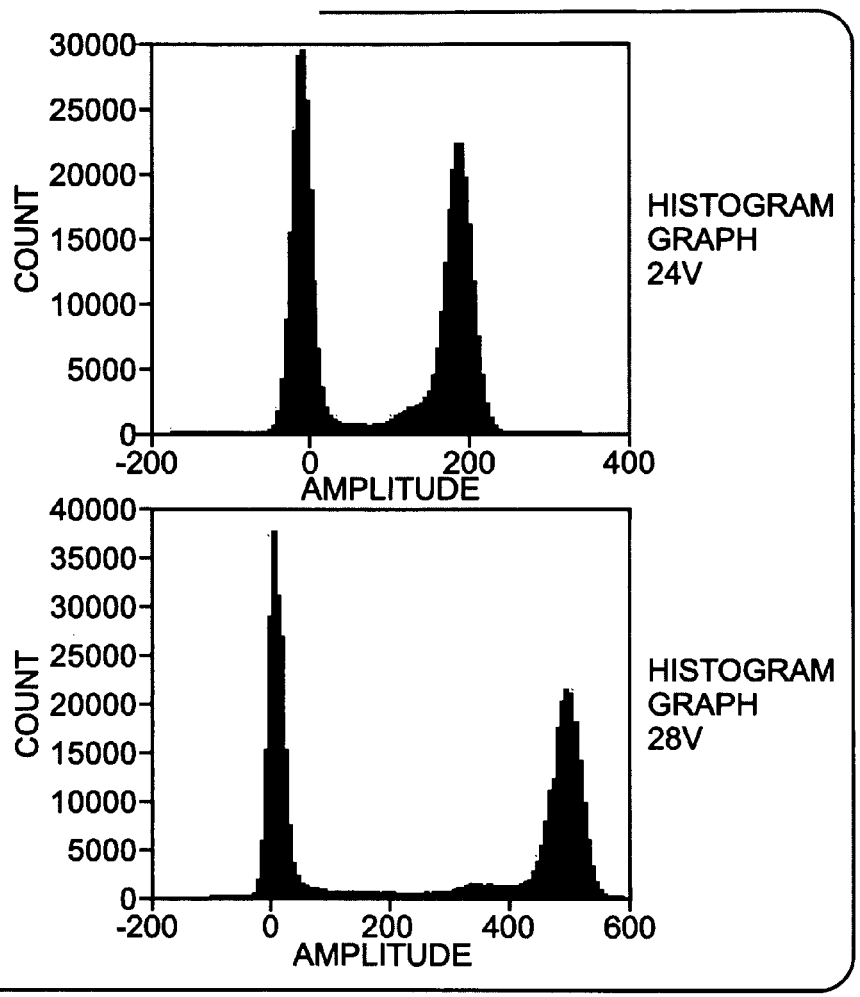
FIGS. 9A through 9C are graphs depicting histogram counts and turn-on voltages for the wafers of Table 1.
Figure 9C:
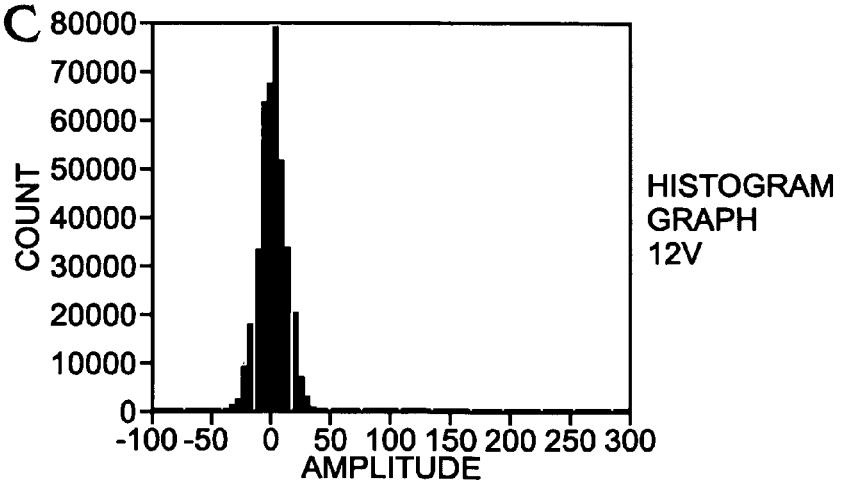
Figure 9B:
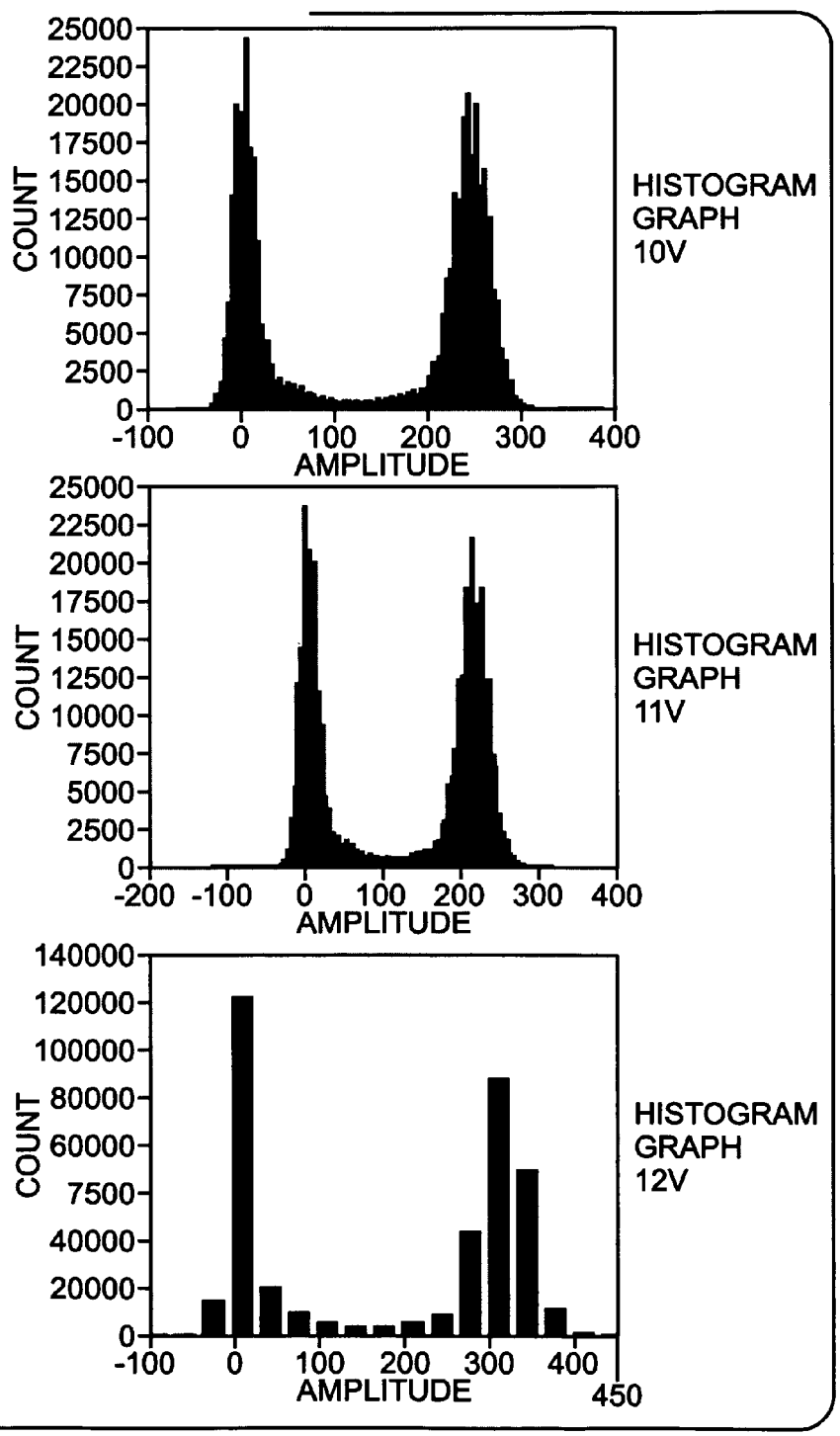

FIGS. 9A through 9C are graphs depicting histogram counts and turn-on voltages for the wafers of Table 1. In FIG. 9A, a conventional SiOx reference wafer 0741-2 is biased at 24V and 28V. It is clearly seen that the turn-on voltage is roughly ~24V for this wafer. In FIG. 9B, wafer 0741-6 is biased from 10V to 12V. With a 9 nm SiNx mid-bandgap layer, the turn-on voltage is <10V, since the histogram peaks are above 200. In FIG. 9C, wafer 0741-7 with 2 nm SiNx mid-bandgap film is biased at 12 V. No emission peaks are observed in the corresponding histogram, showing that an optimal turn-on voltage may be related to the SiNx thickness.

Figure 10:
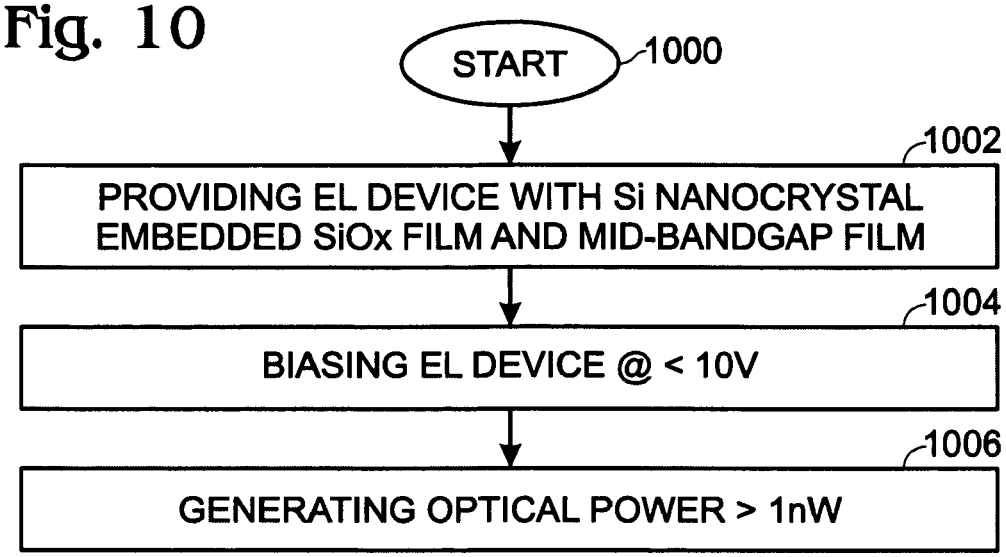
FIG. 10 is a flowchart illustrating a method for operating a Si nanocrystal embedded Si oxide EL device with a mid-bandgap transition layer and an optical power of greater than 0.1 nW.

FIG. 10 is a flowchart illustrating a method for operating a Si nanocrystal embedded Si oxide EL device with a mid-bandgap transition layer and an optical power of greater than 0.1 nW. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 provides an EL device with a highly doped Si bottom electrode, a mid-bandgap electrically insulating dielectric film overlying the Si bottom electrode, a Si nanocrystal embedded SiOx film overlying the mid-bandgap electrically insulating dielectric film, where X is less than 2, and a transparent top electrode overlying the Si nanocrystal embedded SiOx film, see FIG. 5B. A highly doped Si substrate may have a conductivity of 0.05-0.005 ohms-cm. The mid-bandgap electrically insulating dielectric film has a bandgap of about half that of the Si nanocrystal embedded SiOx film. Step 1004 biases the EL device with a voltage of less than 10 volts. Step 1006 generates a surface emission power of greater than 0.03 watts per square meter (W/m$^2$). In one aspect, the emissions wavelength is in the range of 600 to 1100 nm with a spectral width of about 150 nm (Full Width at Half Magnitude).

In another aspect, providing the EL device in Step 1002 includes providing an EL device with a mid-bandgap electrically insulating dielectric film having a bandgap (Eg) of about 5 electronvolts (eV) and a Si nanocrystal embedded SiOx film having a bandgap of about 10 eV. For example, a silicon nitride (SiNy) mid-bandgap electrically insulating dielectric film can be used having a bandgap of about 5 eV, where Y is about 4/3. In one aspect, the SiNy film has a thickness in the range of 1 to 30 nm.

In another aspect, Step 1002 provides an EL device with a Si nanocrystal embedded SiOx film having Si nanocrystal with a diameter in the range of about 2 to 10 nm. Typically, the Si nanocrystal embedded SiOx film layer has a thickness is a range of 20 to 300 nm.

Figure 11:
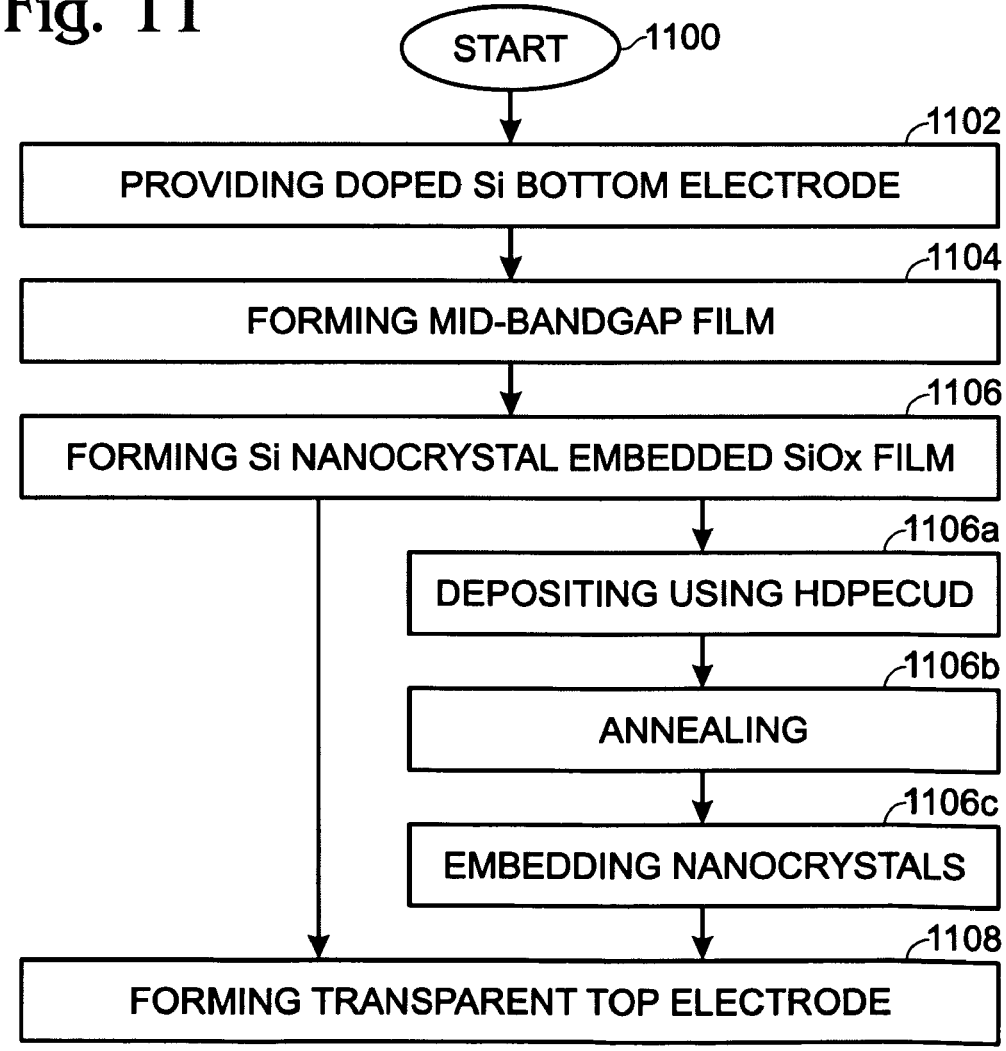
FIG. 11 is a flowchart illustrating a method for forming a Si nanocrystal embedded Si oxide EL device with a mid-bandgap transition region.

FIG. 11 is a flowchart illustrating a method for forming a Si nanocrystal embedded Si oxide EL device with a mid-bandgap transition layer. The method starts at Step 1100. Step 1102 provides a highly doped Si bottom electrode. Step 1104 forms a mid-bandgap electrically insulating dielectric film overlying the Si bottom electrode. Step 1106 forms a Si nanocrystal embedded SiOx film overlying the mid-bandgap electrically insulating dielectric film, where X is less than 2. Step 1108 forms a transparent top electrode overlying the Si nanocrystal embedded SiOx film.

The bandgap of the mid-bandgap electrically insulating dielectric film formed in Step 1104 is about half that of the bandgap of the Si nanocrystal embedded SiOx film. For example, the Si nanocrystal embedded SiOx film formed in Step 1106 may have a bandgap (Eg) of about 10 eV, and the mid-bandgap electrically insulating dielectric film formed in Step 1104 may have a bandgap of about 5 eV. More particularly, the mid-bandgap electrically insulating dielectric film may be a SiNy film, having a bandgap of about 5 eV, where Y is about 4/3. Typically, the SiNy film has a thickness in the range of 1 to 30 nanometers (nm).

In one aspect, forming the Si nanocrystal embedded SiOx film in Step 1106 includes depositing the film using a HDPECVD process. The HDPECVD process uses a plasma concentration of greater than $1 \times 10^{11}$ cm$^{-3}$, with an electron temperature of less than 10 eV. If the HDPECVD process is used, Step 1106 may include substeps. The SiOx film is deposited by HDPECVD in Step 1106*a*. Subsequent to depositing a SiOx film layer, Step 1106*b* anneals, and in response, Step 1106*c* embeds Si nanocrystals in the SiOx film layer.

Some particulars of depositing the Si nanocrystal embedded SiOx film in Step 1106*a* include:

introducing silane (SiH$_4$) in the range of about 20 to 40 standard cubic centimeters (SCCM);

introducing N$_2$O in the range of about 15 to 35 SCCM;

supplying power to a top electrode at a frequency in a range of 13.56 to 300 megahertz (MHz), and a power density in a range of about 1 to 20 watts per square centimeter (W/cm$^2$); and, supplying power to a bottom electrode at a frequency in a range of 50 kilohertz to 13.56 MHz, and a power density in a range of about 1 to 5 W/cm$^2$. In one aspect, Step 1106*b* anneals for a duration of about 10 to 120 minutes, at a temperature in the range of about 500 to 1100° C.

Step 1106 forms a Si nanocrystal embedded SiOx film having emission wavelength in the range of 600 to 1100 nm with a spectral width of about 150 nm (FWHM), responsive to ratio of SiH$_4$ and N$_2$O in the HDPECVD deposition process. Step 1106 typically forms a SiOx film with a thickness is the range of 20 to 300 nm, with Si nanocrystals having a diameter in the range of about 2 to 10 nm.

The SiNy layer formed in Step 1104 may be formed through conventional PECVD processes or the HDPECVD process.

Figure 12:
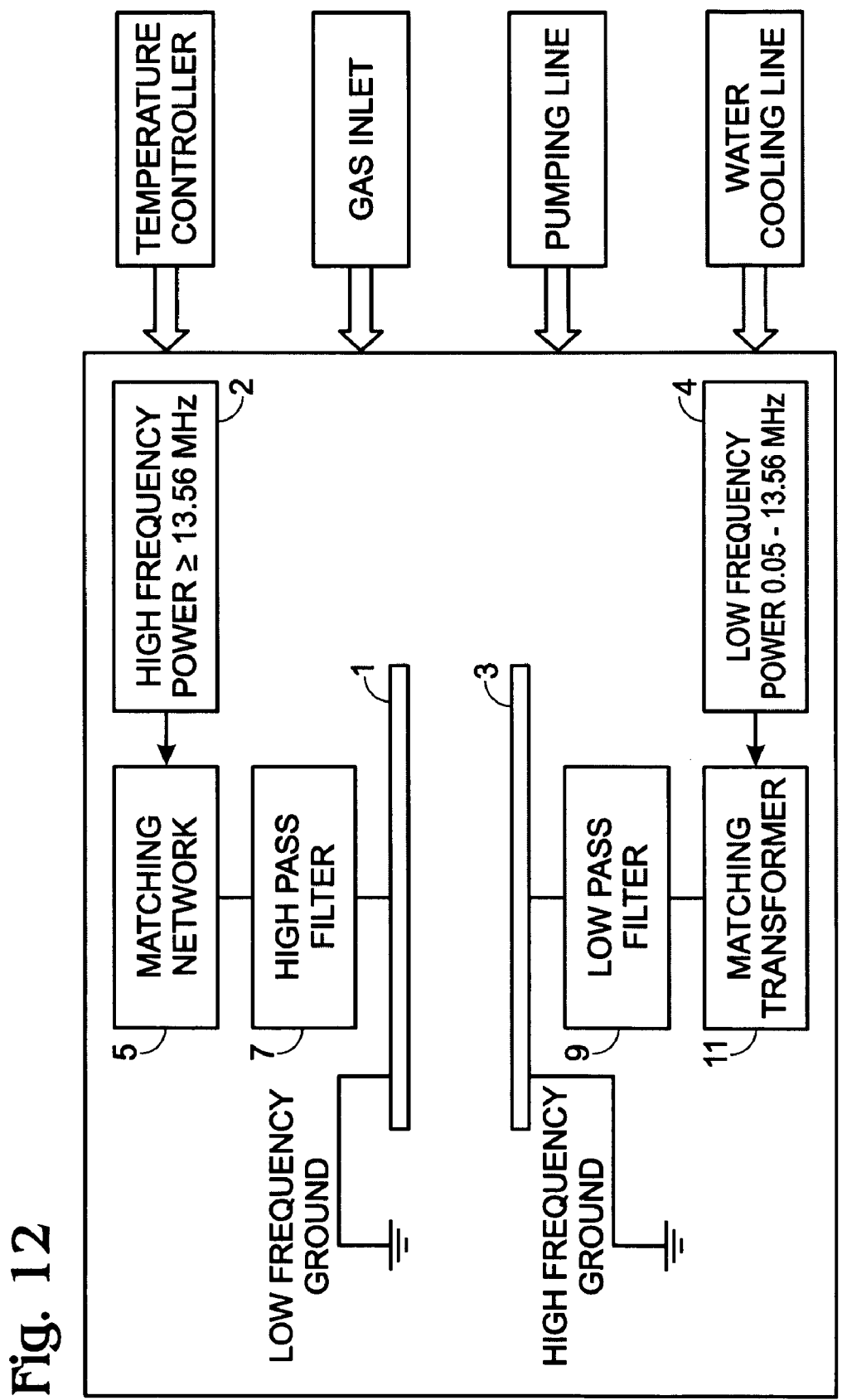
FIG. 12 is a schematic drawing of a high-density plasma (HDP) system with an inductively coupled plasma source.

FIG. 12 is a schematic drawing of a high-density plasma (HDP) system with an inductively coupled plasma source. The system depicted in FIG. 12 is one example of a system that can be used to enable the above-described HDPECVD process for the deposition of Si-nc SiOx. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter (W/cm$^2$), while the bottom electrode power can be as great as about 3 W/cm$^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high density plasma process with an electron concentration of greater than 1×10$^{11}$ cm$^{-3}$, and the electron temperature is less than 10 eV. There is no need to maintain a bias differential between the capacitor connected to the top electrode and the system body, as in many high density plasma systems and conventional designs such as capacitively-coupled plasma tools. Alternately stated, both the top and bottom electrodes receive RF and low frequency (LF) powers.

A method for fabrication and operating an EL device have been presented, where the EL device includes a Si nanocrystal embedded SiOx film and a mid-bandgap electrically insulating dielectric film. Explicit structures and process details have been given to illustrate the invention. However, the invention is not limited to merely these examples. Other variations and embodiments of the invention will occur to those skilled in the art.

We claim:

1. A method for forming a silicon (Si) nanocrystal embedded Si oxide electroluminescence (EL) device with a mid-bandgap transition layer, the method comprising:
   providing a highly doped Si bottom electrode;
   forming a mid-bandgap electrically insulating dielectric film overlying the Si bottom electrode;
   depositing a Si nanocrystal embedded SiOx film overlying the mid-bandgap electrically insulating dielectric film, where X is less than 2, using a high density plasma-enhanced chemical vapor deposition (HDPECVD) process as follows;
   introducing silane (SiH$_4$) in a range of about 20 to 40 standard cubic centimeters (SCCM);
   introducing N$_2$O in a range of about 15 to 35 SCCM;
   supplying power to a top electrode at a frequency in a range of 13.56 to 300 megahertz (MHz), and a power density in a range of about 1 to 20 watts per square centimeter (W/cm$^2$); and,
   supplying power to a bottom electrode at a frequency in a range of 50 kilohertz to 13.56 MHz, and a power density in a range of about 1 to 5 W/cm$^2$;
   subsequent to depositing a SiOx film layer, annealing;
   in response to the annealing, embedding Si nanocrystals in the SiOx film layer;
   forming a transparent top electrode overlying the Si nanocrystal embedded SiOx film; and,
   where the bandgap of the mid-bandgap electrically insulating dielectric film is about half that of the bandgap of the Si nanocrystal embedded SiOx film.

2. The method of claim 1 wherein forming the Si nanocrystal embedded SiOx film includes forming a Si nanocrystal embedded SiOx film having a bandgap (Eg) of about 10 electronvolts (eV); and,
   wherein forming the mid-bandgap electrically insulating dielectric film includes forming a mid-bandgap electrically insulating dielectric film having a bandgap of about 5 eV.

3. The method of claim 2 wherein forming the mid-bandgap electrically insulating dielectric film includes forming a silicon nitride (SiNy) film, having a bandgap of about 5 eV, where Y is about 4/3.

4. The method of claim 3 wherein forming the SiNy film includes forming a SiNy film having a thickness in a range of 1 to 30 nanometers (nm).

5. The method of claim 3 wherein forming the SiNy film includes depositing the SiNy film using a PECVD process.

6. The method of claim 1 wherein annealing the SiOx insulating film layer includes annealing:
   for a duration in a range of about 10 to 120 minutes; and,
   at a temperature in a range of about 500 to 1100° C.

7. The method of claim 1 wherein forming the Si nanocrystal embedded SiOx film includes forming a Si nanocrystal embedded SiOx film having emission wavelength in a range of 600 to 1100 nm with a spectral width of about 150 nm (Full Width at Half Magnitude), responsive to ratio of SiH$_4$ and N$_2$O in the HDPECVD deposition process.

8. The method of claim 1 wherein depositing the Si nanocrystal embedded SiOx film using the HDPECVD process includes using a plasma concentration of greater than 1×10$^{11}$ cm$^{-3}$, with an electron temperature of less than 10 eV.

9. The method of claim 1 wherein forming the Si nanocrystal embedded SiOx film includes forming the Si nanocrystal embedded SiOx film with Si nanocrystals having a diameter in a range of about 2 to 10 nm.

10. The method of claim 1 wherein forming the Si nanocrystal embedded SiOx film includes forming the SiOx film with a thickness is a range of 20 to 300 nm.

* * * * *